US011205894B1

(12) United States Patent
Scheel

(10) Patent No.: US 11,205,894 B1
(45) Date of Patent: Dec. 21, 2021

(54) PORT CONTROLLER POWER PATH SHORT DETECTION

(71) Applicant: Alpha and Omega Semiconductor International LP, Toronto (CA)

(72) Inventor: Michael Scheel, San Jose, CA (US)

(73) Assignee: Alpha and Omega Semiconductor International LP, Toronto (CA)

( * ) Notice: Subject to any disclaimer, the term of this patent is extended or adjusted under 35 U.S.C. 154(b) by 0 days.

(21) Appl. No.: 16/913,460

(22) Filed: Jun. 26, 2020

(51) Int. Cl.
*H02H 7/00* (2006.01)
*H02H 7/20* (2006.01)
*G01R 31/52* (2020.01)
*H02H 1/00* (2006.01)

(52) U.S. Cl.
CPC ............. *H02H 7/20* (2013.01); *G01R 31/52* (2020.01); *H02H 1/0007* (2013.01)

(58) Field of Classification Search
None
See application file for complete search history.

(56) References Cited

U.S. PATENT DOCUMENTS

| 9,652,351 | B2 | 5/2017 | Srivastava et al. | |
| 10,573,997 | B1* | 2/2020 | Fong | H03K 17/0812 |
| 2011/0248835 | A1* | 10/2011 | Speegle | H05B 47/185 340/12.32 |
| 2013/0054983 | A1* | 2/2013 | Zhou | G06F 1/266 713/300 |
| 2016/0188514 | A1* | 6/2016 | Forghani-Zadeh | G06F 1/266 710/313 |
| 2017/0060216 | A1 | 3/2017 | Waters et al. | |
| 2019/0067931 | A1* | 2/2019 | Li | H02H 3/16 |

* cited by examiner

*Primary Examiner* — Stephen W Jackson
(74) *Attorney, Agent, or Firm* — Carmen C. Cook

(57) ABSTRACT

A multi-port system and method implements fault detection using a resistor connected to each port controller where the resistors of at least two port controllers are connected together in parallel. Each port controller supplies a predetermined current to the associated resistor and senses the resistor voltage of the parallelly connected resistors to detect for a fault condition. A failure condition is indicated when the resistor voltage is outside of a given threshold window. In this manner, for a single point failure, such as a short along the power path of a port controller, the other port controller senses a change in the resistor voltage and can assert a fault signal. In one embodiment, the fault signal is an open drain output and operates to pull down on a fault bus, which disables all the port controllers in the system through a disable input.

20 Claims, 6 Drawing Sheets

| Number of Parallel RSENSE Resistors | RSENSE Voltage $V_R$ With One Port failure (V) |
|---|---|
| 1 | 0 |
| 2 | 0.495 |
| 3 | 0.660 |
| 4 | 0.743 |
| 5 | 0.792 |
| 6 | 0.825 |
| 7 | 0.849 |
| 8 | 0.866 |
| 9 | 0.880 |
| 10 | 0.891 |

Fig. 5

PORT CONTROLLER POWER PATH SHORT DETECTION

FIELD OF THE INVENTION

The invention relates to short detection in multi-port systems and, in particular, to the detection of single point failure in a multi-port system.

BACKGROUND OF THE INVENTION

Electronic systems, such as laptop computers, often includes one or more serial ports, such as universal serial bus (USB) ports, for serial data communication as well as for power delivery with external devices. In some examples, rechargeable portable equipment requires an external power source to charge its batteries and USB ports have become a convenient means for charging because of the available bus power as power source. Power delivery using USB ports have gained further popularity with the introduction of USB-C standard and the USB Power Delivery (USB-PD) standard. The USB-PD standard is a specification for handling higher power and allows a range of devices to charge quickly over a USB connection. The USB-PD standard operates by facilitating a conversation between two devices to negotiate a power contract so they can determine how much power can be pulled from the charger. Power Delivery starts at the 5V setting and is configurable up to 20V. The USB-PD standard enables power delivery up to 60 W using a standard USB-C cable. Another feature of USB Power Delivery is that it allows for power to flow both ways, with no set direction based on circuit or connection.

Devices such as laptop computers, laptop docking stations, serial hubs, chargers or adapters include one or more ports to support power delivery. These ports are sometimes referred to as power delivery charge ports. In a parallel multi-port system, each port is coupled to a port controller to provide power control and protection functions at the port. A power delivery port controller connects a power provider and a power consumer at a port and enables negotiation between the devices to establish the power contract. Implementation of port controllers typically includes fault detection and protection to ensure that a failure at one port does not cause catastrophic damage to the other port or to the connected devices.

BRIEF DESCRIPTION OF THE DRAWINGS

Various embodiments of the invention are disclosed in the following detailed description and the accompanying drawings.

FIG. 5 is table illustrating representative resistor voltage values for different number of parallelly connected sense resistors in some examples.

DETAILED DESCRIPTION

According to embodiments of the present invention, a multi-port system and method implements power path short detection using a resistor connected to each port controller where the resistors of at least two port controllers are connected together in parallel. Each port controller supplies a predetermined current to the associated resistor and senses the resistor voltage of the parallelly connected resistors to detect for a fault condition. A failure condition is indicated when the resistor voltage is outside of a given threshold window. In this manner, for a single point failure, such as a short along the power path of a port controller, the other port controller senses a change in the resistor voltage and can assert a fault signal. In one embodiment, the fault signal is an open drain output and operates to pull down on a fault bus, which disables all the port controllers in the system through a disable input.

Figure 1:
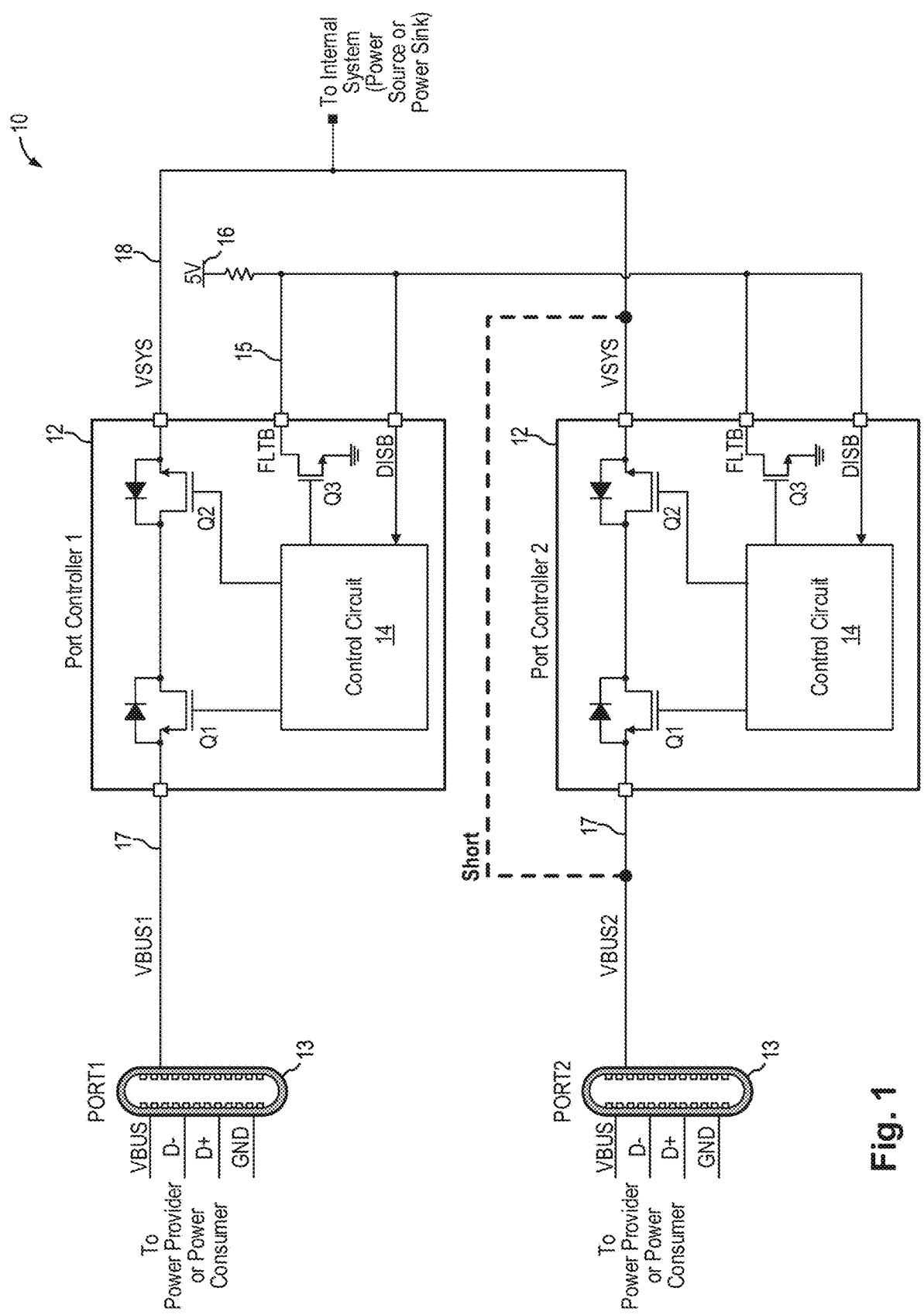
FIG. 1 illustrates a multi-port system including port controllers connected to respective serial ports in some examples of the present disclosure.

FIG. 1 illustrates a multi-port system including port controllers connected to respective serial ports in some examples of the present disclosure. Referring to FIG. 1, a multi-port system 10 includes a pair of port controllers 12 coupled to control respective serial ports 13, including Port1 and Port2. In particular, the port controller 1 is coupled to serial port Port1 while the port controller 2 is coupled to serial port Port 2. The power path of the port controller 12 is connected to an internal system bus VSYS 18 and a port power bus VBUS 17. In the present description, the ports 13 are configured for bidirectional power flow. Thus, each port 13 can be connected to a power provider (a power source or a power supply) or a power consumer (a power sink or a load). The multi-port system 10 can be configured in the sink configuration where ports 13 are upstream facing port sinking or consuming VBUS power supplied by an external device. That is, a power source supplies power to serial port 13 on the VBUS power bus which is used to drive the internal system coupled to the internal system bus VSYS 18. The multi-port system 10 can also be configured in the source configuration where ports 13 are downstream facing port providing power to an external device. That is, the internal system is a power source, such as a charger, which supplies power to serial port 13 on the VBUS power bus which is used to drive the external device coupled to the serial port 13.

Each port controller 12 includes a pair of blocking power switches Q1 and Q2 forming the power path for controlling the power transfer between two input/output nodes 17, 18. Each port controller 12 further includes a control circuit 14 driving the power switches Q1 and Q2 and also providing control, fault detection and protection functions. In the present example, the power switches Q1 and Q2 are constructed as back-to-back field effect transistors (FETs). By using the blocking power switches Q1 and Q2 in each port controller 12, each port is isolated from the other port and no current passes from one port to another port.

By way of explanation, assuming the multi-port system 10 is in a sink configuration, when an external device is connected to a port 13, such as Port 1, the device provides 5V on VBUS1. The device can then negotiate through the port controller 1 for a higher voltage in the event that the device is capable of providing power at a higher voltage, e.g. 20V. After the negotiation handshake, the port controller 1 determines the device can handle a higher voltage and enables VBUS1 to increase to 20V. The internal system bus VSYS 18 is in turns also driven to 20V.

The port controller 12 is configured to detect a variety of fault conditions, such as short, over-current or over-voltage, and assert the fault signal. In the present description, the fault signal is an open drain signal FLTB generated at a transistor Q3. The control circuit 14 of the port controller 12, upon detection of a fault condition, asserts the control signal to transistor Q3 to turn on the transistor. The transistor Q3 pulls down on the fault signal FLTB to indicate a detected fault condition. The open drain transistor Q3 is resistively connected to a power supply 16 providing a given voltage (e.g. 5V). The open drain transistor Q3 of all the port controllers 12 are connected together to the fault signal bus 15 which is resistively connected to the power supply 16. Each port controller 12 also receives a disable signal DISB which is connected to fault signal bus 15. Accordingly, when one of the port controller 12 asserts the fault signal and pulls down on the fault signal bus 15, the disable signal DISB of all the port controllers will be asserted (active low) and the control circuit 14 in each port controller 12 will turn off the power switches and disable the power path in each port controller. In this manner, in the multi-port system 10 including multiple parallel ports, the fault signal FLTB of one port controller is asserted to disable all the port controllers.

In one fault scenario, the source terminals of the power switches Q1 and Q2 of port controller 2 are shorted together externally, that is, shorted together external to the port controller circuit as shown in FIG. 1. The port controller 2 can detect the fault and pulls down the fault signal FLTB at port controller 2, which pulls down on the fault signal bus 15, thereby disabling the power switches of port controller 1 and port controller 2. If the short is externally across the port controller circuit, the port controller can report the fault with no issue. The problem occurs when the short is internal to the port controller and is destructive to the port controller. The integrity of the port controller integrated circuit is lost and the ability to report the fault is no longer possible.

Figure 2:
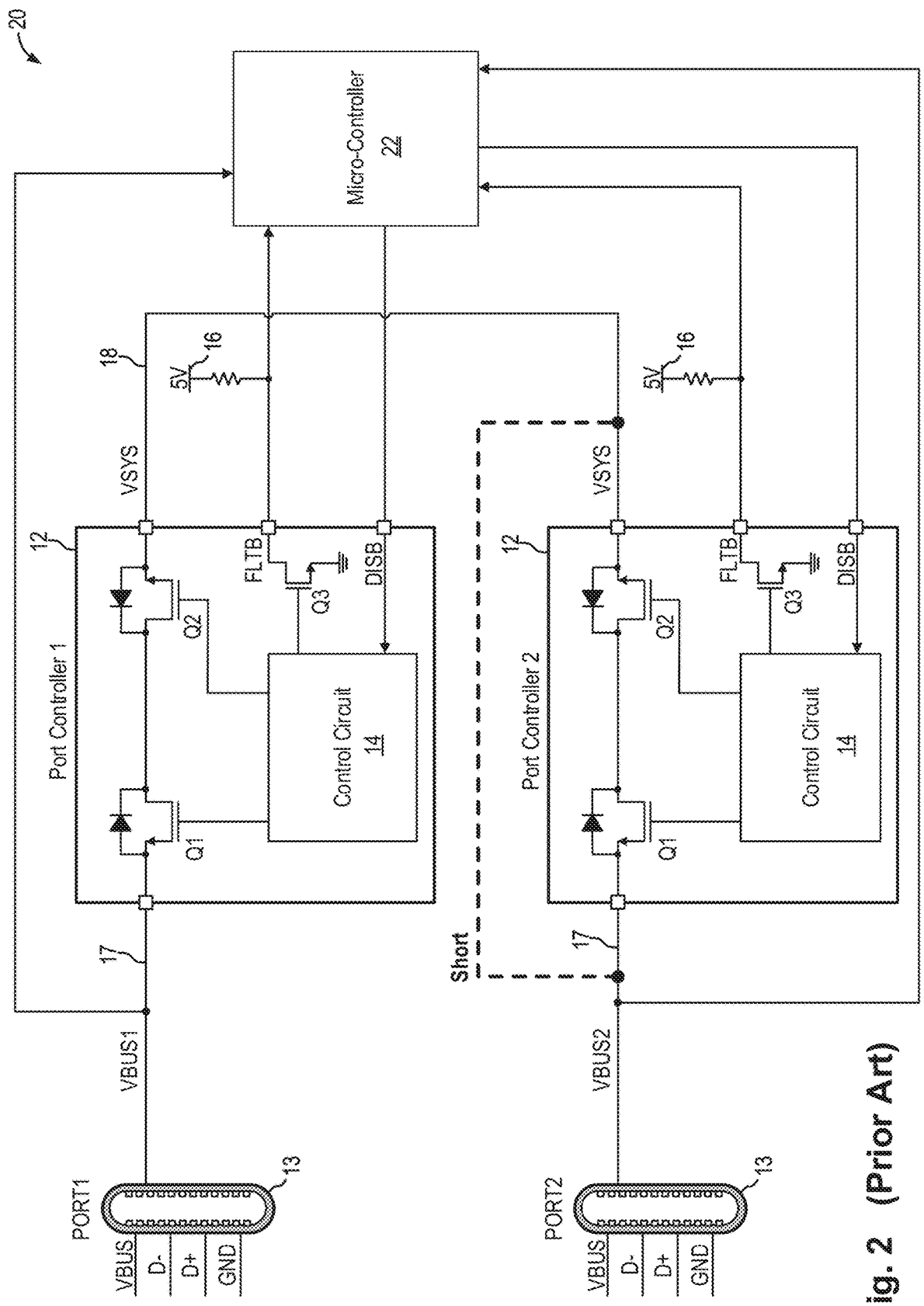
FIG. 2 illustrates a multi-port system incorporating a micro-controller for fault detection and protection in some examples.

To prevent the possibility of a fault not being reported, some prior art solution uses a secondary micro-controller to detect and disable all the ports, as shown in FIG. 2. FIG. 2 illustrates a multi-port system incorporating a micro-controller for fault detection and protection in some examples. Referring to FIG. 2, to protect for fault detection in the event that a port controller suffers catastrophic damage, a micro-controller 22 is added to the multi-port system 20. The micro-controller monitors all the fault conditions in the system 20 and provides the disable signal to the port controllers. Implementation using the micro-controller 22 increases the complexity of the multi-port system 20 as additional bus lines are needed to enable the micro-controller 22 to monitor the status of the voltages in the multi-port system 20. The additional of the micro-controller also increases the implementation cost of the multi-port system 20.

In embodiments of the present disclosure, a multi-port system implements fault detection using a resistor RSENSE connected to each port controller and also connected in parallel with at least one other resistor. The resistor voltage is sensed to detect for fault condition. In this manner, only a simple resistor is needed to detect fault condition even in the event of catastrophic failure of the port controller. The resistor sensing fault detection scheme adds a RSENSE monitoring pin to the port controller. The resistor sensing fault detection scheme is particularly advantageous for addressing single point failures in a multi-port application that damages the port controller. With the RSENSE resistor, the multi-port system retains the ability to report and protect adjacent ports. Furthermore, the resistor monitoring scheme can be implemented with reduced complexity and reduced cost, representing a marked improvement over conventional solutions using a micro-controller.

Figure 3:
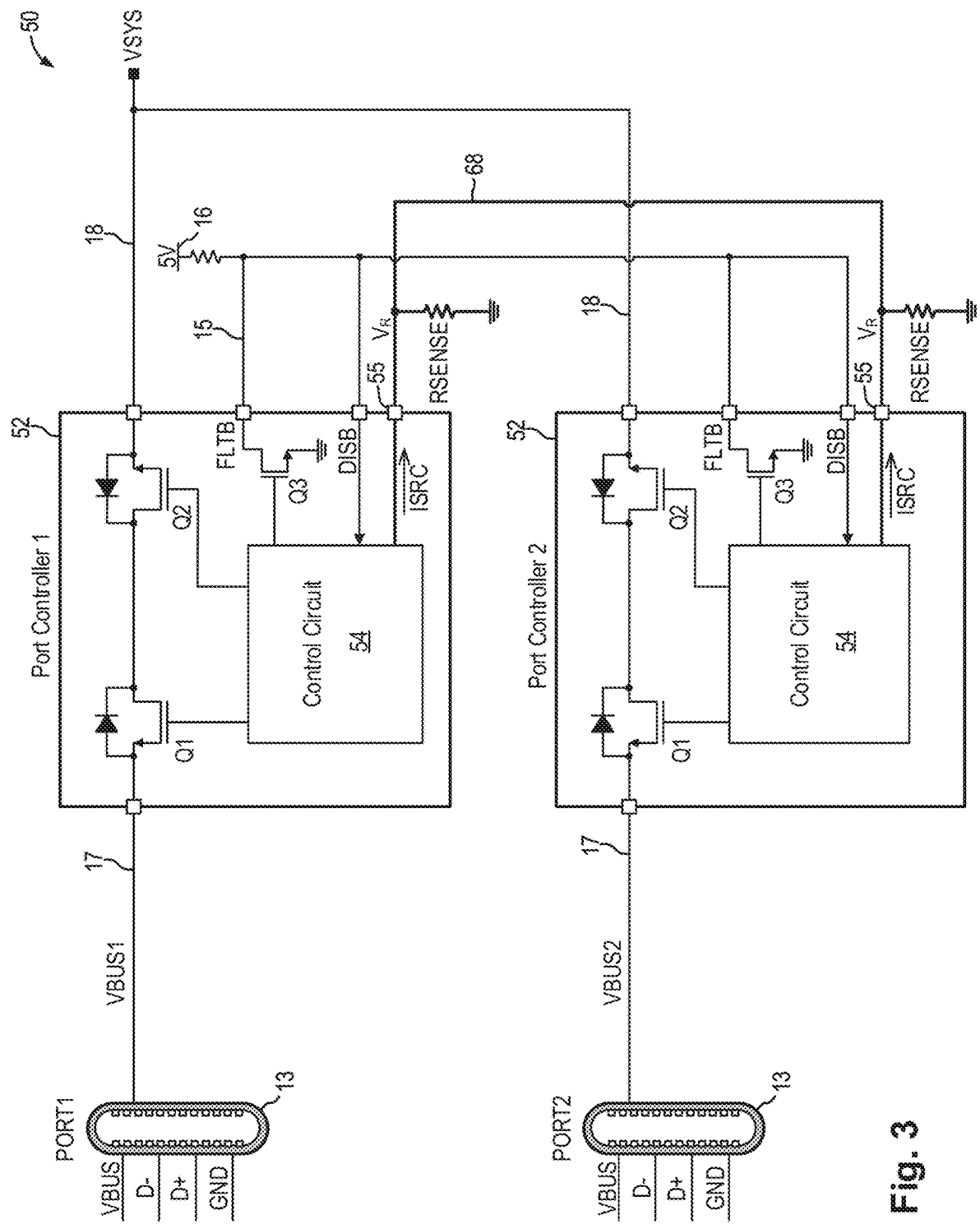
FIG. 3 is a schematic diagram of a multi-port system implementing a resistor sensing fault detection scheme in embodiments of the present disclosure.

FIG. 3 is a schematic diagram of a multi-port system implementing a resistor sensing fault detection scheme in embodiments of the present disclosure. Referring to FIG. 3, a multi-port system 50 includes port controllers 52 coupled to respective serial ports 13. The multi-port system 50 is constructed in a similar manner to the multi-port system 10 of FIG. 1, with the addition of the resistor RSENSE to implement the resistor sensing fault detection scheme. Similar elements in FIGS. 1 and 3 are given like reference numerals to simplify the discussion.

In the present embodiment, multi-port system 50 includes a pair of port controllers 52 coupled to control respective serial ports 13, including Port1 and Port2. In particular, the port controller 1 is coupled to serial port Port1 while the port controller 2 is coupled to serial port Port 2. In some embodiments, serial ports 13 are Type C ports, or USB-C ports. The power path of each port controller 52 is connected to an internal system bus VSYS 18 and a port power bus VBUS 17. In the present description, the ports 13 are configured for bidirectional power flow. Thus, each port 13 can be connected to a power provider (a power source or a power supply) or a power consumer (a power sink or a load). The multi-port system 50 can be configured in the sink configuration or a source configuration where ports 13 are either coupled to a power provider or a power consumer.

In the present description, the multi-port system 50 is illustrated as including two ports, each coupled to a respective port controller. In other embodiments, the multi-port system can include two or more ports, each port coupled to respective port controller. The use of two ports in multi-port system 50 is illustrative only and not intended to be limiting.

Each port controller 52 includes a pair of blocking power switches Q1 and Q2 forming the power path and a control circuit 54 driving the power switches and also providing for control, fault detection and protection functions. In the present example, the power switches Q1 and Q2 are constructed as back-to-back field effect transistors (FETs). By using the blocking power switches Q1 and Q2 in each port controller 52, each port is isolated from the other port and no current passes from one port to another port. More specifically, the source terminal of power switch Q1 is connected to the port power bus VBUS 17 and the source terminal of the power switch Q2 is connected to the internal system bus VSYS 18. The drain terminals of the power switches Q1 and Q2 are connected together. The gate terminals of power switches Q1 and Q2 are controlled by the control circuit 54. The control circuit 54 turns on the power switches Q1 and Q2 to enable the power path and turns off the power switches Q1 and Q2 to disable the power path.

The port controller 52 is configured to detect a fault condition, such as short, over-current or over-voltage, and asserts a fault signal FLTB. In the present description, the fault signal FLTB is an open drain signal generated at a transistor Q3. The control circuit 54 of the port controller 52, upon detection of a fault condition, asserts the control signal to transistor Q3 to turn on the transistor. The transistor Q3 pulls down on the fault signal FLTB to indicate a detected fault condition. The open drain transistor Q3 is resistively connected to a power supply 16 providing a given voltage (e.g. 5V). The fault signal FLTB of all the port controllers 52 are connected together to the fault signal bus 15 which is resistively connected to the power supply 16. Each port controller 52 also includes a disable signal DISB which is connected to fault signal bus 15. Accordingly, when one of the port controller 52 asserts the fault signal and pulls down on the fault signal bus 15, the disable signal DISB of all the port controllers will be asserted (active low) and the control circuit 54 in each port controller 52 will turn off the power switches and disable the power path in each port controller.

In embodiments of the present disclosure, each port controller 52 includes a resistor monitoring terminal 55 to which a sense resistor RSENSE is coupled. In particular, the sense resistor RSENSE is connected between the resistor monitoring terminal 55 and the ground potential. Furthermore, in multi-port system 50, at least two of the sense resistor RSENSE are connected together in parallel. For instance, the RSENSE resistor for port controller 1 and the RSENSE resistor for port controller 2 may be connected together by a bus 68 so that the two resistors are connected in parallel between the bus 68 and the ground potential. The control circuit 54 in each port controller 52 is configured to provide a current ISRC to the resistor monitoring terminal 55 which is then flow to the sense resistor RSENSE. The control circuit 54 in each port controller 52 is further configured to monitor a resistor voltage at the resistor monitoring terminal 55 to detect for a fault condition. In particular, the port controller 52 implements the resistor sensing fault detection scheme using the sense resistor RSENSE to enable detection of a fault condition even when one of the port controllers in the multi-port system 50 has suffered catastrophic damage and is no longer functioning. The resistor sensing fault detection scheme enables one port controller to monitor another port controller and to indicate a fault condition when the other port controller has failed.

In embodiments where the multi-port system includes more than two ports, the resistor sensing fault detection scheme can be implemented by connecting all the sense resistors RSENSE together in parallel and monitoring the resistor voltage at the common node. Alternately, the resistor sensing fault detection scheme can be implemented by connecting groups of sense resistors together in parallel, each group including two or more sense resistors. The resistor monitoring terminals of the port controllers can be connected in numerous combinations to provide reliable fault detection.

More specifically, as thus configured, the resistance as seen at the bus 68 (and at each resistor monitoring terminal 55) is resistance of the parallel combination of the RSENSE resistors. Assuming the resistance of each RSENSE resistor is $R_S$ and there are N parallel RSENSE resistors, the total resistance $R_T$ at bus 68 and at each resistor monitoring terminal 55 is given as:

$$\frac{1}{R_T} = \frac{N}{R_S}, \text{ or } R_T = \frac{R_S}{N}.$$

In one example, the sense resistor RSENSE has a resistance of 100 kΩ. A parallel combination of two RSENSE resistors will have a resistance $R_T$ of 50 kΩ.

Each control circuit 54 monitors the resistor voltage $V_R$ at the resistor monitoring terminal 55. The resistor voltage $V_R$ is given as the product of the total current provided to the parallel resistor combination and the total resistance $R_T$. When all the port controllers are functional, the resistor voltage $V_R$ has an expected voltage value. Using the same assumption as above, for N parallel RSENSE resistors, the control circuits 54 of all the port controllers 52 provides N*ISRC amount of current to the resistors. Thus, when there are no fault condition in the multi-port system 50, the expected resistor voltage $V_R$ is given as:

$$V_R = (N*ISRC)*R_T = (N*ISRC)*(R_S/N) = ISRC/R_S.$$

In one example, the sense resistor RSENSE has a resistance of 100 kΩ and the current ISRC is 10 µA and the expected resistor voltage as seen by all the control circuits 54 is 1V.

In the event that one of the port controllers becomes dysfunctional, that port controller is no longer providing the current ISRC to the resistor monitor terminal 55. In that case, the missing current will result in a drop in the resistor voltage $V_R$. This is because the remaining amount of current is now divided by the same amount of parallel RSENSE resistors.

In the example shown in FIG. 3, in the case where two RSENSE resistors are connected together, the normal resistor voltage $V_R$ is 1V for RSENSE resistance of 100 kΩ and current ISRC of 10 µA. However, if assuming port controller 2 becomes damaged and is no longer supplying current ISRC to the resistor monitoring terminal 55, then the resistor voltage $V_R$ would become $(1/N)(ISRC/R_S)=0.5V$. The control circuit 54 of port controller 1 detects the resistor voltage $V_R$ has decreased below a given level, indicating a fault condition. Thus, port controller 1 can assert the fault signal FLTB which asserts the disable signal DISB to disable the power switches Q1 and Q2. If the case where there are more than 2 port controllers in the multi-port system, the assertion of the fault signal FLTB will cause all the other port controllers to shut down to protect all the port controllers. In this manner, when one port controller fails in a multi-port system, the resistor sensing fault detection scheme of the present disclosure enables the other port controllers to detect the fault and to activate protection schemes.

In embodiments of the present disclosure, the resistor sensing fault detection scheme enables one port controller to monitor all the other port controllers that have sense resistors connected in parallel. Thus, for a group of N port controllers with connected sense resistors, a single port controller can monitor N-1 port controllers at a time.

In some embodiments, the port controllers are constructed as integrated circuit. For example, each port controller is constructed as a packaged integrated circuit chip. The resistor monitoring terminal 55 is a formed as a pin on the integrated circuit chip.

Figure 4:
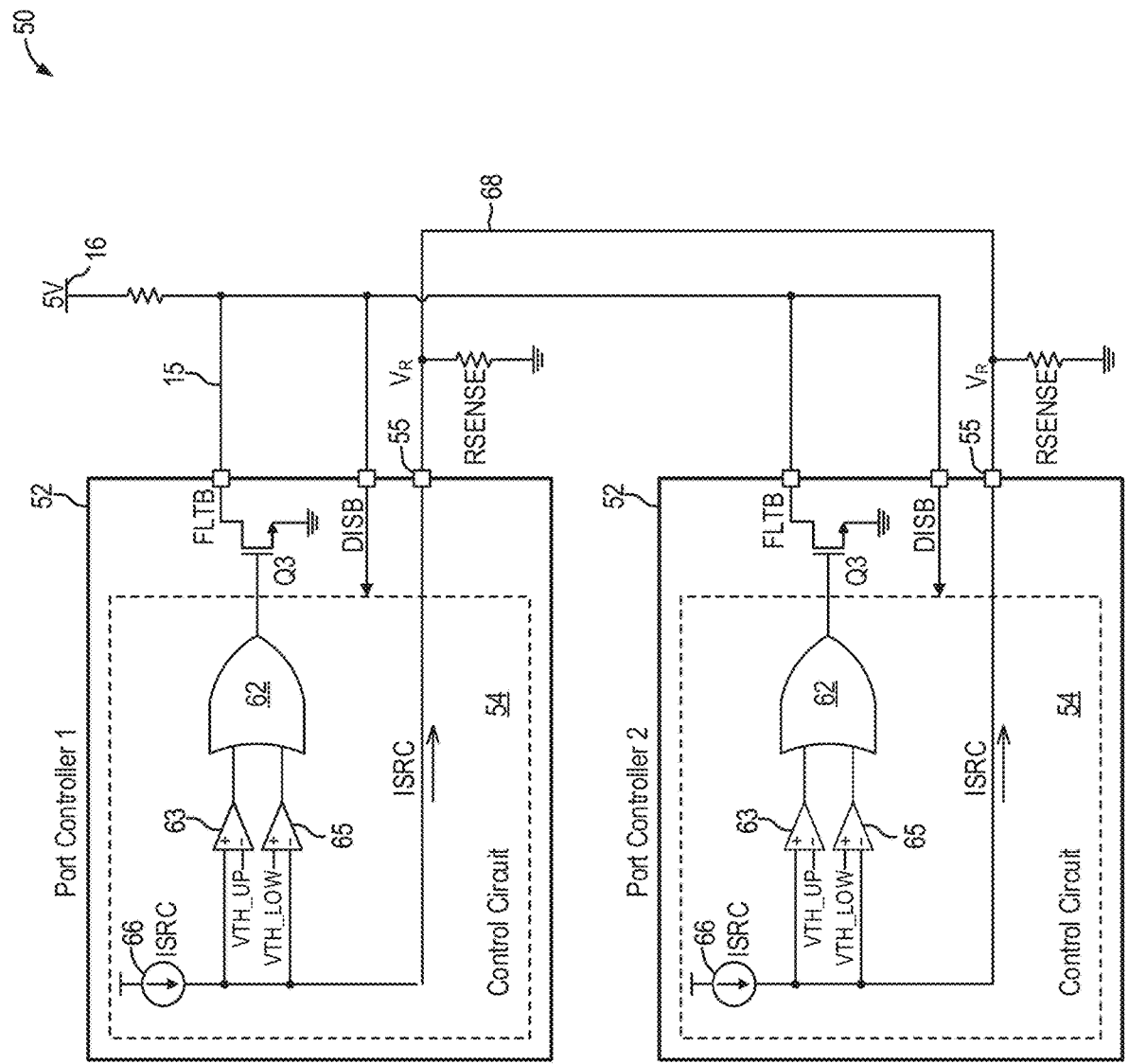
FIG. 4 is a schematic diagram illustrating circuit implementation of the resistor sensing fault detection scheme in a multi-port system in embodiments of the present disclosure.

FIG. 4 is a schematic diagram illustrating circuit implementation of the resistor sensing fault detection scheme in a multi-port system in embodiments of the present disclosure. Like elements in FIGS. 3 and 4 are given like reference numerals and will not be further discussed. Referring to FIG. 4, each port controller 52 implements resistor sensing fault detection by monitoring the resistor voltage $V_R$ using a window comparator comparing the resistor voltage $V_R$ to an upper threshold voltage VTH_UP and to a lower threshold voltage VTH_LOW. In normal operation, with N sense resistors RSENSE connected in parallel and supplied by N*ISRC current, the resistor voltage $V_R$ has an expected voltage value within the threshold window, that is between the upper threshold and the lower threshold. In the event that one of the port controller malfunctions, the resistor voltage $V_R$ will drop and fall out of the threshold window. In that case, the window comparator detects the fault condition and asserts the fault signal FLTB.

More specifically, the resistor sensing fault detection scheme is implemented in each port controller 52 as follows.

A current source 66 provides a current ISRC to the resistor monitoring terminal 55. The resistor voltage $V_R$ (on node 55) is monitored by a pair of comparators 63, 65 forming a window comparator. In particular, the comparator 63 compares the resistor voltage $V_R$ (on node 55) to the upper threshold voltage VTH_UP and the comparator 63 asserts its comparator output signal in response to the resistor voltage $V_R$ being greater than the upper threshold voltage VTH_UP. That is, the resistor voltage $V_R$ is coupled to the positive input terminal of the comparator 63 and the upper threshold voltage VTH_UP is coupled to the negative input terminal of the comparator 63. Meanwhile, the comparator 65 compares the resistor voltage $V_R$ (on node 55) to the lower threshold voltage VTH_LOW and the comparator 65 asserts its comparator output signal in response to the resistor voltage $V_R$ being less than the lower threshold voltage VTH_LOW. That is, the resistor voltage $V_R$ is coupled to the negative input terminal of the comparator 65 and the lower threshold voltage VTH_LOW is coupled to the positive input terminal of the comparator 65.

The output terminals of the comparators 63 and 65 are coupled to a logical OR gate 62. Accordingly, in response to either one of the comparator output signals being asserted, indicating the resistor voltage $V_R$ being outside of the threshold window, the OR gate 62 asserts its output signal which turns on open drain transistor Q3. Transistor Q3 pulls down on its drain terminal to assert the fault signal FLTB. As discussed before, as a result of transistor Q3 of one of the port controllers turning on to pull down on the fault signal FLTB, the disable signal DISB connected to the fault signal bus 15 of all the port controllers 52 are asserted (active low). In response to the disable signal DISB being asserted, the control circuits 54 of the port controllers 52 turns off the power switches Q1 and Q2 and thereby disabling the power path.

In this manner, by sourcing current through the sense resistor and monitoring the voltage across the sense resistor using a window comparator, one port controller can detect the creditability of another port controller. When a port controller in a multi-port system malfunctions, another port controller with a connected sense resistor is able to monitor the status of the port controller and report the fault condition. In one embodiment, for a system with two sense resistors connected in parallel, the sense resistor RSENSE having a resistance of 100 kΩ and the current ISRC being 10 µA so that the expected resistor voltage as seen by all the control circuits 54 is 1V, the threshold window uses 1.2V for the upper threshold voltage VTH_UP and 0.8V for the lower threshold voltage VTH_LOW.

In embodiments of the present disclosure, the upper threshold voltage VTH_UP is selected to account for the worst case source current ISRC tolerance along with specified tolerance of the sense resistor RSENSE. Meanwhile, the lower threshold voltage VTH_LOW is selected as a function of the number of parallel sense resistors being connected together, and to account for current source and sense resistor resistance value tolerance, as will be described in more detail below.

Accordingly, to guarantee protection in multi-port system 50, one port controller only needs one other port controller for verification and the two port controllers can monitor each other. In some embodiments, in a multi-port system including 40 ports, the 40 port controllers can be connected in pairs to enable one port controller to monitor the other port controller in the pair. In that case, the resistor voltage $V_R$ drops by 50% when one port controller in the pair fails and the window comparator can easily detect the fault condition.

In embodiments of the present disclosure, the threshold window is selected to enable the detection of a single port failure within variations of the resistance and current values. FIG. 5 is table illustrating representative resistor voltage values for different number of parallelly connected sense resistors in some examples. In the present example, the sense resistor RSENSE is assumed to have a resistance of 100 kΩ and the current ISRC is assume to be 10 µA. The expected resistor voltage $V_R$ the control circuits 54 is 1V when all port controllers are functioning.

Referring to FIG. 5, the table 80 illustrates the resistor voltage $V_R$ in the event of one port controller failure for different numbers of sense resistor RSENSE connected in parallel. The first case of one RSENSE resistor will result in a resistor voltage of 0V if the one port controller failed. In the case two RSENSE resistors are connected in parallel, when one of the port controller failed, the resistor voltage drops from 1V to 0.495V. Therefore, a lower threshold voltage VTH_LOW of 0.6 or 0.7V will be adequate to detect the fault condition.

In the case three RSENSE resistors are connected in parallel, when one of the port controller failed, the resistor voltage drops from 1V to 0.66V. Therefore, a lower threshold voltage VTH_LOW of 0.8V may be adequate to detect the fault condition.

In the case ten RSENSE resistors are connected in parallel, when one of the port controller failed, the resistor voltage drops from 1V to 0.891V. Therefore, a lower threshold voltage VTH_LOW of 0.9V may be needed to detect the fault condition.

In particular, the resistor voltage $V_R$ for M resistors connected in parallel and M current source supplying current ISRC is given as:

$$V_R = (M * \text{ISRC}) * R_T = (M * \text{ISRC}) * (R_S/M).$$

In the event of one port failure, that is, one port controller malfunctioning, the number of current sources providing current ISRC decreases to (M−1). The resistor voltage $V_R$ becomes lowered to:

$$V_R = ((M-1) * \text{ISRC}) * (R_S/M).$$

Accordingly, the lower threshold voltage VTH_LOW can have a voltage value selected to discriminate a resistor voltage $V_R$ in the case of (M−1) current source ISRC and M resistors connected in parallel. That is, the lower threshold voltage VTH_LOW is selected to detect one port failure in M parallelly connected resistors.

As the number of sense resistors connected in parallel increases, the resistor voltage $V_R$ for one port controller failure increases so that a smaller margin exists between the expected resistor voltage and the resulting resistor voltage. Accordingly, in the case the multi-port system includes a large number of ports, it is advantages to connect the sense resistors in pairs to obtain the largest margin in resistor voltage drop due to port controller failure.

In one example, the resistor sensing fault detection scheme is implemented using a minimum of two port controllers to monitor each other. In some embodiments, the lower threshold voltage VTH_LOW is selected to have a value to detect the case of four connected sense resistors. For example, the lower threshold voltage VTH_LOW can be selected to have a value of 0.8V. In that case, the lower threshold voltage VTH_LOW can detect a single point failure in a multi-port system including two, three or four port controllers. For multi-port system with greater than four ports, it may be advantageous to connect the sense resistors in pairs or in groups of two or three sense resistors. In that case, the detection margin is guaranteed and the resistor sensing fault detection scheme performs effectively to detect fault conditions.

Figure 6:
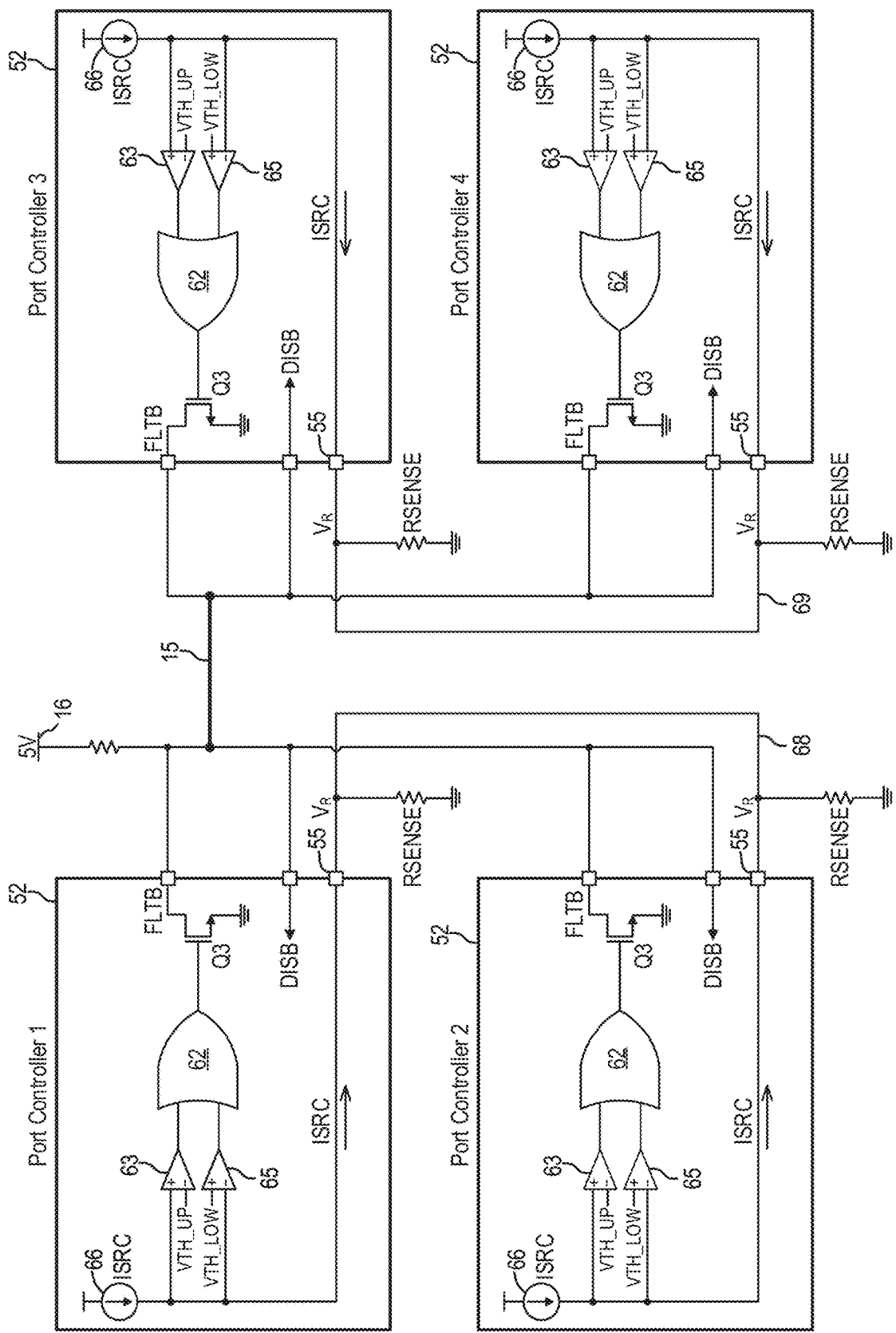
FIG. 6 is a schematic diagram illustrating circuit implementation of the resistor sensing fault detection scheme in a four-port system in embodiments of the present disclosure.

FIG. 6 is a schematic diagram illustrating circuit implementation of the resistor sensing fault detection scheme in a four-port system in embodiments of the present disclosure. Referring to FIG. 6, in the 4-port system 70, the sense resistors RSENSE are connected in pairs so that two port controllers monitor each other. In this manner, the bus routing and control circuit design can be simplified and threshold voltage comparison margin can be improved.

In the present example, port controller 1 and port controller 2 have their sense resistors connected together in parallel by bus 68. Meanwhile, port controller 3 and port controller 4 have their sense resistors connected together in parallel by a separate bus 69. In the case that all four power controllers share the same power path, the fault signal bus 15 connects the fault signals of all four port controllers. The disable signal DISB of all four port controllers are also connected to the fault signal bus 15. In this manner, port controller 1 and port controller 2 monitor each other and provide a fault signal that is asserted to disable all four port controllers in the event of a fault condition. Similarly, port controller 3 and port controller 4 monitor each other and provide a fault signal that is asserted to disable all four port controllers in the event of a fault condition.

The four-port system 70 of FIG. 6 illustrates one embodiment of implementing the resistor sensing fault detection scheme and is not intended to be limiting. In other embodiments, a multi-port system can implement the resistor sensing fault detection scheme of the present disclosure by connecting two or more of the sense resistors in parallel for fault detection and connecting the fault signal bus of the port controllers that share a power path together. In embodiments of the present disclosure, the sense resistors can be connected in groups or all the sense resistors in a multi-port system can be connected in parallel.

The invention can be implemented in numerous ways, including as a process; an apparatus; a system; a composition of matter; a computer program product embodied on a computer readable storage medium; and/or a processor, such as a hardware processor or a processor device configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A method in an electronic system including a plurality of serial ports, each serial port being coupled to a port controller circuit, the method comprising:
    coupling, at each serial port, a resistor between a first node of the port controller circuit and a ground potential, the resistor having a first resistance value;
    supplying to the first node at each port controller circuit a current having a first current value;
    connecting together electrically at least two of the first nodes of the port controller circuits of the plurality of serial ports, the resistors associated with the connected first nodes being connected in parallel;
    sensing, at each port controller circuit, a first voltage at the first node, wherein the first voltage is indicative of the voltages across the parallelly connected resistors and the current flowing into the parallelly connected resistors;
    in response to the first voltage being within a predetermined voltage window, generating at a first port controller circuit, a first signal having a first state indicating no failure detected in the port controller circuits having resistors that are connected in parallel with the resistor of the first port controller circuit;
    in response to the first voltage being outside the predetermined voltage window, generating, at the first port controller circuit, the first signal having a second state indicating a failure detected in at least one of the port controller circuits having resistors that are connected in parallel with the resistor of the first port controller circuit; and
    in response to the first signal having the second state, disabling the port controller circuits of the plurality of serial ports.

2. The method of claim 1, wherein connecting together electrically at least two of the first nodes of the port controller circuits of the plurality of serial ports comprises:
    connecting together electrically the first nodes of the port controller circuits of the plurality of serial ports.

3. The method of claim 1, wherein the plurality of serial ports comprises N serial ports coupled to respective N port controller circuits, and wherein connecting together electrically at least two of the first nodes of the port controller circuits of the plurality of serial ports comprises:
    connecting together electrically the first nodes of the port controller circuits in pairs, the first nodes of the N port controller circuits being divided into N/2 pairs of connected first nodes;
    generating, at each port controller circuit, a fault signal in response to the first signal; and
    connecting the fault signal of the N port controller circuits together.

4. The method of claim 1, wherein the predetermined voltage window comprises an upper threshold voltage and a lower threshold voltage, the first voltage being within the predetermined voltage window in response to the first voltage being less than the upper threshold voltage and greater than the lower threshold voltage.

5. The method of claim 4, wherein the upper threshold voltage comprises a voltage value indicative of the product of the first current value and the resistance value of the resistors connected in parallel.

6. The method of claim 5, wherein for a group of M resistors connected in parallel, the lower threshold voltage comprises a voltage value indicative of the product of (M−1) times the first current value and the resistance value of the M resistors connected in parallel.

7. The method of claim 1, further comprising:
generating, at each port controller circuit, a fault signal in response to the first signal;
connecting the fault signal of the plurality of port controller circuits together;
generating, at each port controller circuit, a disable signal in response to the fault signal;
in response to the first signal having the second state at a first port controller circuit, asserting the fault signal at the first port controller circuit; and
in response to the fault signal being asserted, asserting the disable signal at each of the port controller circuits to disable the plurality of port controller circuits.

8. The method of claim 1, further comprising:
enabling a power path at each port controller circuit to facilitate power transfer between a respective serial port and an internal system bus; and
disabling the power path at each port controller circuit to disable the port controller circuit in response to the first signal having the second state.

9. A system including a plurality of serial ports, the system comprising:
a plurality of port controller circuits, each port controller circuit being coupled to a respective serial port, each port controller circuit including a first node and a current source supplying a first current having a first current value to the first node; and
a plurality of resistors, each resistor being connected between the first node of a respective port controller circuit and a ground potential, the resistor having a first resistance value,
wherein at least two of the first nodes of the port controller circuits are connected together electrically, the resistors associated with the connected first nodes being connected in parallel; wherein each port controller circuit senses a first voltage at the first node, and in response to the first voltage being within a predetermined voltage window, a first port controller circuit generates a first signal having a first state indicating no failure detected in the port controller circuits having resistors that are connected in parallel with the resistor of the first port controller circuit, and in response to the first voltage being outside the predetermined voltage window, the first port controller circuit generates the first signal having a second state indicating a failure detected in at least one of the port controller circuits having resistors that are connected in parallel with the resistor of the first port controller circuit; and wherein in response to the first signal having the second state, the plurality of port controller circuits are disabled.

10. The system of claim 9, wherein the first nodes of the plurality of port controller circuits are connected together electrically.

11. The system of claim 9, wherein the system comprises N serial ports coupled to respective N port controller circuits, the first nodes of the N port controller circuits are connected together electrically in pairs to form N/2 pairs of connected first nodes.

12. The system of claim 9, wherein the first voltage is indicative of the voltages across the parallelly connected resistors and the current flowing into the parallelly connected resistors.

13. The system of claim 9, wherein the predetermined voltage window comprises an upper threshold voltage and a lower threshold voltage, the first voltage being within the predetermined voltage window in response to the first voltage being less than the upper threshold voltage and greater than the lower threshold voltage.

14. The system of claim 13, wherein the upper threshold voltage comprises a voltage value indicative of the product of the first current value and the resistance value of the resistors connected in parallel.

15. The system of claim 14, wherein for a group of M resistors connected in parallel, the lower threshold voltage comprises a voltage value indicative of the product of (M−1) times the first current value and the resistance value of the M resistors connected in parallel.

16. The system of claim 13, wherein the first current value comprises 10 μA and the first resistance value comprises 100¹a and wherein the upper threshold voltage comprises 1.2V and the lower threshold voltage comprises 0.8V.

17. The system of claim 9, wherein each port controller circuit comprises:
a first comparator coupled to compare the first voltage to an upper threshold voltage, the first comparator asserting its output signal in response to the first voltage being greater than the upper threshold voltage;
a second comparator coupled to compare the first voltage to a lower threshold voltage, the second comparator asserting its output signal in response to the first voltage being less than the lower threshold voltage; and
a logic gate configured to receive the output signals of the first comparator and the second comparator, the logic gate generating a second signal having the first state in response to the output signals of the first and second comparators being deasserted and generating the second signal having the second state in response to the output signals of the first and second comparators being asserted.

18. The system of claim 17, wherein each port controller circuit further comprises:
a first transistor having a first current terminal connected to a second node, a second current terminal connected to the ground potential and a control terminal coupled to receive the second signal, the second node providing the first signal as a fault signal,
wherein the second nodes of the plurality of port controller circuits are connected is together electrically, and wherein, in response to the second signal having the second state, the fault signal is asserted.

19. The system of claim 18, wherein each port controller circuit further comprises a third node receiving a disable signal, the third nodes of the plurality of port controller circuits being connected together and connected to the second nodes, wherein in response to the fault signal being asserted, the disable signal at each port controller circuit is asserted to disable the respective port controller circuit.

20. The system of claim 9, wherein each port controller circuit further comprises a power path to facilitate power transfer between a respective serial port and an internal system bus, wherein the plurality of port controller circuits are disabled by disabling the power path at each port controller circuit in response to the first signal having the second state.

* * * * *